United States Patent [19]

De Bakker et al.

[11] Patent Number: 5,384,154

[45] Date of Patent: Jan. 24, 1995

[54] METHOD OF SELECTIVELY PROVIDING A PATTERN OF A MATERIAL OTHER THAN GLASS ON A GLASS SUBSTRATE BY ELECTROLESS METALLIZATION

[75] Inventors: Johannes W. G. De Bakker; Lambertus G. J. Fokkink; Andreas M. T. P. Van Der Putten; Henricus A. M. Kox, all of Eindhoven, Netherlands

[73] Assignee: U.S. Philips Corporation, New York, N.Y.

[21] Appl. No.: 238,190

[22] Filed: May 4, 1994

Related U.S. Application Data

[63] Continuation of Ser. No. 77,972, Jun. 15, 1993, abandoned, which is a continuation of Ser. No. 896,267, Jun. 10, 1992, abandoned.

[30] Foreign Application Priority Data

Jun. 12, 1991 [EP] European Pat. Off. ............ 91201439

[51] Int. Cl.⁶ ............................................. B05D 5/12
[52] U.S. Cl. ...................................... 427/123; 427/125; 427/304; 427/305; 427/404; 427/437; 427/443.1; 427/443.2
[58] Field of Search ............... 427/123, 125, 304, 305, 427/404, 437, 443.1, 443.2

[56] References Cited

U.S. PATENT DOCUMENTS

| | | | |
|---|---|---|---|
| 2,430,581 | 11/1947 | Pessel | 427/123 |
| 3,011,920 | 12/1961 | Shipley, Jr. | 427/437 |
| 3,294,578 | 12/1966 | Popeck | 427/437 |
| 3,414,427 | 12/1968 | Levy | 427/437 |
| 3,627,558 | 12/1971 | Roger et al. | 427/437 |
| 3,874,897 | 4/1975 | Fadgen, Jr. et al. | 106/1.11 |
| 3,958,048 | 5/1976 | Donovan et al. | 427/437 |
| 4,089,686 | 5/1978 | Townsend | 427/305 |
| 4,424,241 | 1/1984 | Abys | 427/437 |
| 4,478,690 | 10/1984 | Scheltens | 427/443.1 |
| 4,719,145 | 1/1988 | Neely | 427/305 |
| 4,824,693 | 4/1989 | Schlipf et al. | 427/305 |

FOREIGN PATENT DOCUMENTS

| | | |
|---|---|---|
| 4112859 | 11/1991 | Germany . |
| 1222063 | 9/1989 | Japan . |
| 2179881 | 7/1990 | Japan . |

*Primary Examiner*—Shrive Beck
*Assistant Examiner*—Benjamin L. Utech
*Attorney, Agent, or Firm*—Norman N. Spain

[57] ABSTRACT

By virtue of an activating pretreatment with a polymer-stabilized Pd sol, patterns, such as transparent patterns of indium-tin oxide, can be deposited on glass by electroless metallization. For example polyvinyl alcohol is used as the polymer.

15 Claims, 1 Drawing Sheet

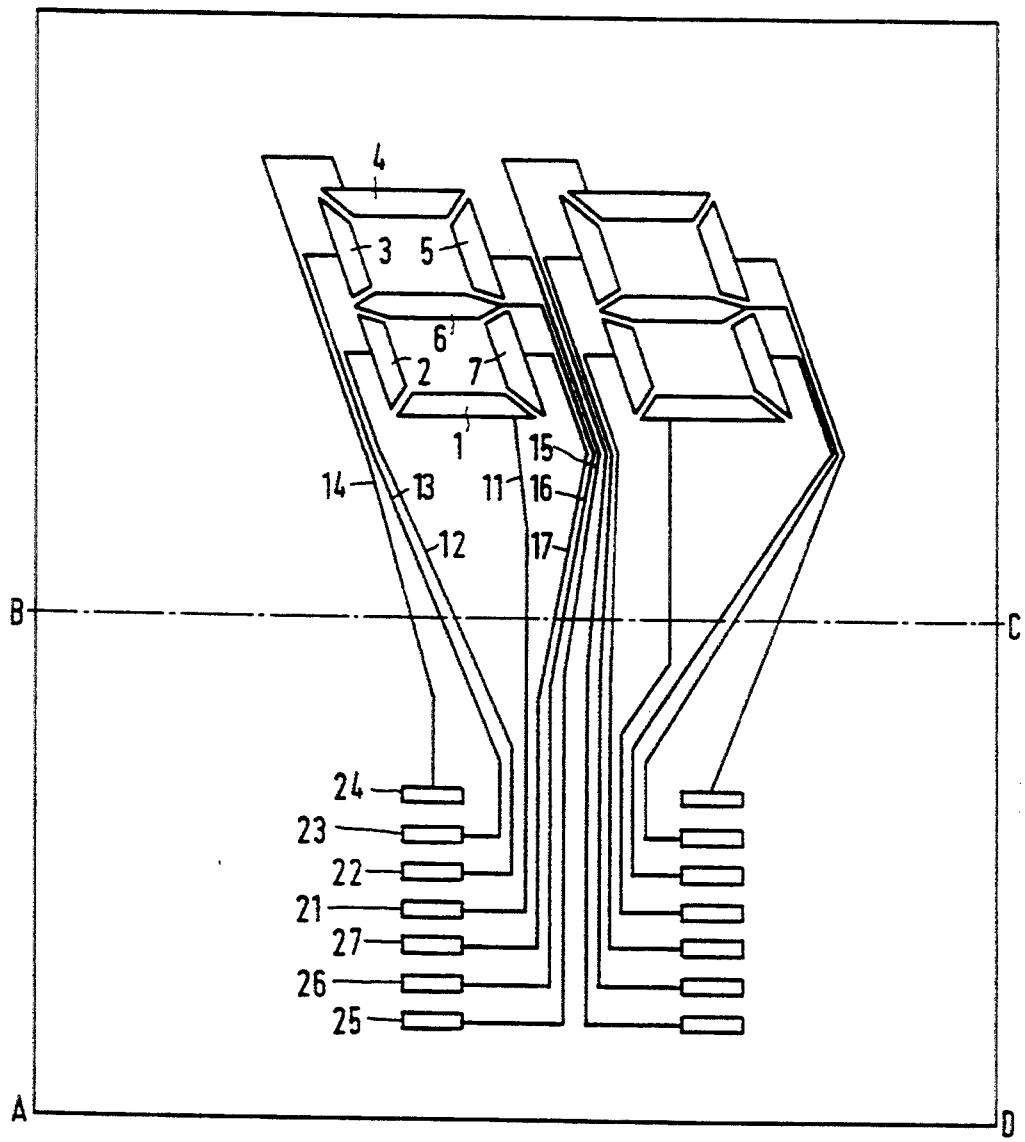

METHOD OF SELECTIVELY PROVIDING A PATTERN OF A MATERIAL OTHER THAN GLASS ON A GLASS SUBSTRATE BY ELECTROLESS METALLIZATION

This is a continuation of prior application Ser. No. 08/077,972, filed on Jun. 15, 1993, now abandoned, which is a continuation of application Ser. No. 07/896,267, filed Jun. 10, 1992, now abandoned.

BACKGROUND OF THE INVENTION

The invention relates to a method of selectively providing a pattern of a material other than glass on a glass substrate by electroless metallization, the pattern and the glass substrate being brought into contact with an aqueous Pd sol after which the pattern is metallized in an electroless metallization bath.

Such a method is used in, for example, the manufacture of electro-optical display devices in which a substance is present between two glass substrates, which substance is subject to an optically perceptible physical change under the influence of an electric field. In such devices, transparent electrodes are present on at least one of the substrates, the second substrate may also be transparent and provided with transparent electrodes. A known display device of this type is, for example, an LCD cell. In the case of such a cell, a liquid-crystalline medium is present between two parallel glass plates. Transparent electrodes are provided on the sides of the glass plates facing the medium, said electrodes generally consisting of a semiconductive metal oxide such as indium-III-oxide and tin-IV-oxide. Such layers, which generally have a thickness of approximately 150 nm, can be provided on the glass plates by sputtering or vacuum evaporation. Such layers can alternatively be provided by Chemical Vapor Deposition or by hydrolysis and pyrolysis of a corresponding metal compound. At present, preferably, layers of indium oxide doped with tin oxide are used, which are generally referred to as ITO. The desired electrode pattern can be obtained by etching the ITO layer according to a pattern. Alternatively, the electrodes can be directly provided on the glass according to the desired pattern, for example, by vacuum evaporation or sputtering according to a pattern using a mask.

The electrodes of such a display device are connected, via conductor lines which also consist of ITO, to contact faces, also consisting of ITO, in order to electrically connect the electrodes to the drive of the display device. For this purpose, ICs can be secured to these contact faces. However, a properly adhering electric connection between the ICs and the contact faces of ITO cannot be obtained directly by soldering nor in any other way. To obtain a properly adhering electric connection, the surfaces serving to establish the electric connection and the parts of the conductor lines which form the connection between the contact faces and the actual electrodes must first be covered with a metal coating. Said metallization also serves to reduce the electric resistance in situ. A suitable method of metallizing ITO consists in immersing the portion to be plated in an electroless metallization bath. This requires the previous activation of the portion to be metallized in an activation treatment. A customary activation treatment for an electroless metallization process consists in successively immersing $SnCl_2$, $AgNO_3$ and $PdCl_2$ in aqueous solutions. The Pd nuclei formed on the surface catalyze the electroless metallization process. A disadvantage of such an activation treatment is that, in general, only the glass is provided with Pd nuclei, not the ITO. As a result thereof, only the glass substrate is metallized in a subsequent metallization process.

U.S. Pat. No. 4,824,693 discloses a method of selectively depositing ITO lines on a glass substrate in an electroless metallization process. To activate the ITO surface, the substrate is immersed in a colloidal Pd solution which has been obtained by mixing $SnCl_2$ and $PdCl_2$ solutions. The activating solution obtained contains a sol of metallic Pd particles which are stabilized by a $Sn^{4+}$ outer sheath. Since such Pd particles also activate the glass, the glass has to be deactivated before carrying out the electroless metallization process. Deactivation takes place in an aqueous solution of hydrogen fluoride (HF).

A disadvantage of the known method is that it requires additional processing steps, i.e. a deactivation step in a HF solution and an associated rinsing step. A further disadvantage of deactivation using a HF solution resides in the fact that the glass substrate is attacked and/or underetching of the ITO tracks takes place. Still another disadvantage of the known method is the poor adhesion of the electrolessly deposited metal layer to the ITO tracks.

SUMMARY OF THE INVENTION

It is an object of the invention to provide, inter alia, a universal method of selectively metallizing patterns of, inter alia, ITO relative to glass in fewer process steps than in the known method, in which inventive method no HF is used and the metal layer obtained bonds very well to the pattern.

According to the invention, this object is achieved by a method as described in the opening paragraph, which is characterized in that Pd sol is stabilized by using a water-soluble polymer. In this connection, a sol is to be understood to mean a colloidal dispersion of Pd.

BRIEF DESCRIPTION OF THE DRAWING

The sole FIGURE of the drawing is an elevational view of a liquid crystalline display device (LCD).

DETAILED DESCRIPTION OF THE INVENTION

It has been found that a Pd sol which is stabilized with such a polymer does not activate the glass, but it does activate other materials such as metals, for example Pt, Ni and Si; metal oxides such as tin oxide, indium oxide, ITO, $TiO_2$ and $Al_2O_3$; metal nitrides such as AlN and $Si_3N_4$; semiconductor materials such as GaAs, GaSb, InSb and polymers such as photoresists. A separate deactivation step using a HF solution and an associated rinsing step are superfluous. In this connection, it is alternatively possible to use quartz, quartz glass and glass ceramic such as Macor TM instead of glass, because these materials are also not activated by a polymer-stabilized Pd sol. The Pd sol can be prepared by adding a suitable reducing agent such as $H_3PO_2$ and dimethyl aminoborane to an aqueous HCl-containing solution of a Pd such as $PdCl_2$, Pd nitrate and Pd acetate, which solution also contains a water-soluble Sa H polymer such as polyvinyl alcohol (PVA) or polyvinyl pyrrolidone (PVP). In this manner, a largely monodisperse Pd sol is obtained whose Pd particles have an average diameter of approximately 4 nm. Steric hindrance by the polymer molecules precludes flocculation of the Pd particles. Without the addition of the polymer, the Pd sol is stable for maximally 30 minutes after which the Pd particles are flocculated and the catalytic activity has disappeared.

Using PVP as the polymer yields a monodisperse Pd sol whose particles have a diameter of 2.5 nm. It has been found that a Pd-PVP sol is more stable than a Pd-PVA sol, so that the first-mentioned sol has a longer useful life. By virtue of the better stability of the Pd-PVP sol, a stable, concentrated stock solution can be prepared which can be diluted, for example 10×, for use. A further advantage of PVP relative to PVA is the reduced degree of foaming of the nucleating solution. It has also been found that a Pd-PVP sol can be rinsed off a substrate more easily than a Pd-PVA sol. Preferably, PVP having an average molecular weight $M_w$ of approximately 10,000 is used (for example K-15 from Fluka). Such a relatively low molecular weight yields a high density of the Pd nuclei on the substrate surface.

The method according to the invention provides a universal process of selectively depositing all kinds of materials other than glass on a glass substrate by metallization. The method according to the invention enables ITO tracks to be uniformly covered with Pd nuclei and, subsequently, metallized in an electroless metallization bath. In this process, the glass substrate is not activated and, hence, not metallized.

All the known baths can be used as electroless metallization baths, for example electroless copper or cobalt baths. Preferably, an electroless nickel bath is used. All known electroless nickel baths can be used, for example baths containing glycine, succinate, or pyrophosphate and commercially available baths such as Enlyte 512 and 514 TM, Shipley 65 TM and Niposit 468 TM. Besides a nickel salt, such a bath always comprises a reducing agent such as a hypophosphite or dimethyl aminoborane. Often, stabilizers such as sulphur compounds or lead salts are present to preclude the spontaneous deposition of nickel.

The method according to the invention is very suitable for the selective activation of ITO patterns on glass such as they are found in LCD cells and screens for liquid crystal television (LCTV).

If desired, the nickel layer can be gold-plated by means of an electroless gold bath, thereby rendering the plating highly suitable for the provision of connections with electrical components such as driving elements, for example by soldering, ultrasonic welding, thermocompression or by using conductive adhesives.

The invention will be explained in greater detail by means of the following exemplary embodiments and with reference to the accompanying drawing FIGURE.

Exemplary Embodiment 1

A polymer-stabilized Pd sol suitable for use in the method according to the invention is prepared as follows. A quantity of 0.6 ml of a $PdCl_2$ solution comprising 10 g/l of $PdCl_2$ and 350 ml/l of concentrated hydrochloric acid in water is diluted with 34 ml of demineralized water. A quantity of 5 ml of a 0.2 wt % polyvinyl alcohol (PVA) solution is added to this solution, the PVA having an average molecular weight of 106,000–110,000 and being 98% hydrolysed. Subsequently, 1 ml of a 0.625 molar $H_3PO_2$ solution is added while stirring. After approximately 50 seconds, the colour of the solution changes from yellow via brown to black, which is caused by the Pd particles formed. The activating solution thus formed is kept under a nitrogen atmosphere to preclude oxidation of the Pd particles by atmospheric oxygen.

Borosilicate glass plates provided with rectangular ITO patterns having dimensions of 100×70 μm and a thickness of 150 nm are used as the test substrate. The rectangles are interconnected by ITO tracks having a width of 15 μm and a length of 30 μm. The square resistance of the ITO is 25 Ω.

The test substrates are degreased with an aqueous solution containing 20 g of sodium gluconate, 25 g of sodium hydroxide and 3 g of Tensachex TM (moistening agent) per liter of said solution.

After rinsing with demineralized water, the test substrates are immersed in the above-mentioned activating solution of PVA-stabilized Pd sol for 4 minutes. Surface analysis by TEM (Transmission Electron Microscopy) shows that the Pd particles obtained have an average diameter of approximately 4 nm. The maximum diameter is approximately 10 nm. A spectrum obtained by XPS (X-ray Photo-electron Spectroscopy) shows Pd peaks originating from Pd particles on the ITO, while the treated glass surface exhibits no Pd peaks. This is indicative of a selective nucleation of ITO relative to glass when a polymer-stabilized Pd sol is used.

Following the activation treatment, rinsing with demineralized water takes place again after which the activated test substrates are introduced into an electroless nickel bath containing 20 g/l of $NiCl_2$, 16 g/l of sodium succinate, 10 g/l of sodium hypophosphite and 2 g/l of sodium acetate in water. The nickel bath is acidified with HCl to a pH of 4.5 and has a temperature of 70° C. A nickel layer having a thickness of 0.6 μm is formed on the ITO patterns and lines in approximately 9 minutes. No nickel is deposited on the glass. The adhesion of the nickel layer obtained to the ITO patterns is excellent and meets the requirements of the so-called tape-test (3 M TM adhesive tape), even without the frequently applied thermal treatment of the nickel layer.

Selective metallization of the ITO patterns and tracks relative to glass also occurs when other electroless nickel baths are used, such as baths on the basis of glycine (pH=3.9) and alkaline nickel baths. The same result is also obtained when commercially available electroless nickel baths such as Enlyte 512 TM (pH=4.6), Shipley 65 TM (pH=4.9) and Enlyte 514 TM (pH=9) are used. In all these baths a hypophosphite is used as the reducing agent. An example of a bath having dimethyl aminoborane as the reducing agent is Niposit 468 TM (pH=7.3) from Shipley. Like the above-mentioned electroless nickel bath, the last-mentioned bath also provides a selective deposition of nickel on the ITO, with an adhesion which meets the requirements of the above-mentioned tape-test.

Comparative Example

The above-mentioned test substrates are degreased in the manner described hereinbefore and activated with a Sn-Pd sol as described in the above-mentioned U.S. Pat. No. 4,824,693. After rinsing with demineralized water, the glass surface is deactivated by immersing the test substrates in a 1 wt % HF solution in water for 2 minutes. Next, the test substrates are rinsed again with demineralized water. Subsequently, the test substrates are immersed in the above-mentioned electroless nickel baths. Using this pretreatment process, only the reactive nickel bath on the basis of pyrophosphate (pH=11) leads to metallization of the ITO surfaces. With the other baths no metallization is observed. Besides, the adhesion of the nickel layer obtained in the pyrophosphate bath is of a poor quality. In the tape-test the entire nickel layer is pulled off the ITO. Apparently, the Sn—Pd sol nucleation of ITO is very mediocre.

Exemplary Embodiment 2

The sole FIGURE of the drawing shows one of the sides of an LCD having electrodes of transparent ITO on a glass plate. The display exhibits nine symbols, each of them consisting of seven segments (1 up to and including 7), which can be used to form the digits 1 up to and including 9 and 0. Each segment is connected to a contact face (21 up to and including 27) by means of a narrow ITO-conductor track (11 up to and including 17). All contact faces and the conductor lines in the area ABCD are coated with a nickel layer according to the inventive method by immersing said area in a PVA-stabilized Pd sol before carrying out the electroless nickel-plating process.

Exemplary Embodiment 3

A quartz-glass plate having rectangular Pt patterns with dimensions of 100×100 μm and a thickness of 50 nm is treated in accordance with the method of exemplary embodiment 1. An excellently adhering nickel layer is formed on the Pt pattern. The quartz glass is not metallized.

Exemplary Embodiment 4

A borosilicate-glass plate having rectangular $Si_3N_4$ patterns with dimensions of 100×100 μm and a thickness of 13 nm is treated in accordance with the method of exemplary embodiment 1. An excellently adhering nickel layer is formed on the $Si_3N_4$ pattern. The glass substrate is not metallized.

We claim:

1. A method of metallizing only a pattern of a material other than glass provided on a glass substrate, said method comprising adding a reducing agent other than $SnCl_2$ and a water-soluble polymer to an aqueous solution of a Pd salt to thereby form a stabilized Pd sol, bringing said pattern and glass substrate into contact with said stabilized Pd sol to thereby activate only said pattern, removing said glass substrate and the resultant activated pattern from contact with said stabilized Pd sol, rinsing said glass substrate and said activated pattern with water and then treating said glass substrate and said pattern with an electroless metallization bath to thereby metallize only said pattern.

2. A method as claimed in claim 1, characterized in that polyvinyl alcohol is used as the polymer.

3. A method as claimed in claim 2, wherein a metal oxide is used as the material of the pattern.

4. A method as claimed in claim 2, wherein indium-tin oxide is used as the metal oxide.

5. A method as claimed in claim 1, characterized in that a metal oxide is used as the material of the pattern.

6. A method as claimed in claim 5, characterized in that indium-tin oxide is used as the metal oxide.

7. A method as claimed in claim 6, characterized in that metallization takes place in an electroless nickel bath.

8. A method as claimed in claim 5, characterized in that the pattern, after metallization, comprises indium-tin oxide lines.

9. A method as claimed in claim 8, characterized in that the indium-tin oxide lines are situated in a LCD cell.

10. A method of metallizing only a pattern of a material other than glass provided on a glass substrate, said method comprising adding a reducing agent other than $SnCl_2$ and a polyvinyl pyrollidone to an aqueous solution of a Pd salt to thereby form a stabilized Pd sol, bringing said pattern and glass substrate into contact with said stabilized Pd sol to thereby activate only said pattern, removing said glass substrate and the resultant activated pattern from contact with said stabilized Pd sol, rinsing said glass substrate and said activated pattern with water and then treating said glass substrate and said pattern with an electroless metallization bath to thereby metallize only said pattern.

11. A method as claimed in claim 3, characterized in that the weight-averaged molecular weight of the polyvinyl pyrrolidone is approximately 10,000.

12. A method as claimed in claim 11, wherein a metal oxide is used as the material of the pattern.

13. The method as claimed in claim 12 wherein indium-tin oxide is used as the metal oxide.

14. A method as claimed in claim 3, wherein a metal oxide is used as the material of the pattern.

15. The method as claimed in claim 14 wherein indium-tin oxide is used as the metal oxide.

* * * * *